United States Patent

Furnival

[15] 3,686,540

[45] Aug. 22, 1972

[54] COLD WELDED-CERAMIC SEMICONDUCTOR PACKAGE

[72] Inventor: Thomas J. Furnival, Logansport, Ind.

[73] Assignee: General Motors Corporation, Detroit, Mich.

[22] Filed: Aug. 3, 1970

[21] Appl. No.: 60,261

[52] U.S. Cl. .......317/234 R, 317/234 A, 317/234 G, 317/234 P, 29/470.1, 29/473.1, 174/52

[51] Int. Cl. .............................H01l 5/00, H01l 3/00

[58] Field of Search......317/234, 235, 235 A, 235 D, 317/235 F, 235 G, 235 H, 235 J, 235 P, 235 W; 29/470, 590, 470.1, 471.9, 472.9, 473.1, 473.3, 473.5, 589; 174/50.5, 52, 50.64

[56] References Cited

UNITED STATES PATENTS

| | | | |
|---|---|---|---|
| 3,182,845 | 5/1965 | Culbertson et al. | 29/470.1 |
| 3,190,952 | 6/1965 | Bitko | 317/234 X |
| 3,226,820 | 1/1966 | Anthony et al. | 317/234 X |
| 3,394,451 | 7/1968 | Stuart | 29/473.1 |
| 3,489,957 | 1/1970 | Dewarga | 317/234 |
| 3,534,233 | 10/1970 | Long | 317/234 |
| 2,897,419 | 7/1959 | Howland et al. | 29/470 |
| 3,249,982 | 5/1966 | Van Couvering et al. | 29/590 |
| 3,532,942 | 10/1970 | Boyer | 317/234 P |
| 3,581,160 | 5/1971 | Piccone | 317/234 P |

*Primary Examiner*—John W. Huckert
*Assistant Examiner*—Andrew J. James
*Attorney*—William S. Pettigrew and R. J. Wallace

[57] ABSTRACT

A hermetically sealed enclosure for a semiconductor device and a method and apparatus for making same is disclosed. A tubular ceramic housing is provided with an integral die on one end. A cold weldable layer is brazed on the integral die. A first cover member is brazed onto the other end providing a hermetic seal there. A second cover member is cold welded to the layer hermetically sealing the one end. The cold welding apparatus includes a pressure equalizing assembly having a pair of spaced resiliently coupled elements with facing hemispherical recesses. One of the elements slides on a bearing ball nested within the recesses to equalize the compressive forces of the cold welding around the end of the housing.

3 Claims, 4 Drawing Figures

INVENTOR.
Thomas J. Furnival
BY
Robert J. Wallace
ATTORNEY

COLD WELDED-CERAMIC SEMICONDUCTOR PACKAGE

CROSS-REFERENCE TO RELATED APPLICATIONS

One aspect of the present invention relates to improvements in the process and device disclosed and claimed in a concurrently filed application by Dale L. Daniels and Thomas J. Furnival, Ser. No. 60,865 filed 8-4-70, and assigned to the assignee of the present invention.

BACKGROUND OF THE INVENTION enclosure.

This invention relates to an enclosure for a semiconductor device, and to a method and apparatus for fabricating such an enclosure.

In order to obtain a hermetic seal at the interface of two ductile metals by cold welding, a compressive force of about 10 – 15 tons or more is often necessary. Additionally, a close tolerance parallelism between die and anvil surfaces is usually recommended. Otherwise, the compressive force can be applied unequally over the interface and high and low pressure regions can result. Too high a pressure in one place can cause a weak or overstressed cold weld, while too low a pressure often results in a pervious or incomplete weld.

To insure that a continuous cold weld is obtained, it has often been necessary to use larger compressive forces with thicker cold weldable pieces. The use of thicker pieces guard against puncture; the use of a larger force insures that the thickness reduction percentage deemed necessary to obtain reliable hermetic seals is accomplished. This procedure, however, can add unwanted expense on the one hand, and can increase the likelihood of damaging an underlying workpiece on the other. Further, while close tolerance parallelism is desirable it can be difficult to achieve and expensive to maintain. For example, it may be necessary to refinish the die and anvil surfaces frequently in certain cold welding applications to eliminate surface irregularities which can be expensive.

An embodiment disclosed in the previously mentioned concurrently filed application shows a ceramic housing in which one end is utilized as an integral die. In conjunction therewith, a continuous ductile layer has its innermost portion brazed to the housing, with its outermost portion overlying the integral die. A rim of a cover member is cold welded to this layer by a movable anvil cooperating with the integral die to produce the required compressive forces. This embodiment as disclosed produces good results.

However, production line yields can be improved if the integral die surface is quite flat and parallelism is maintained within a tolerance of less than about 5 mils. Such parallelism allows one to use thinner cold weldable metal pieces and less compressive force. While a ceramic surface can be provided with this degree of smoothness and end-to-end parallelism by conventional finishing techniques, such a requirement can increase the overall cost of the enclosure. Besides, subsequent handling, unless a high degree of care is maintained, can dame this finish.

SUMMARY OF THE INVENTION

It is an object of this invention to provide a method of cold welding a cover member to a tubular ceramic housing in which close tolerance parallelism between die and opposite end surfaces is not generally required, yet production line yield can be increased.

It is another object of this invention to provide cold welding apparatus which substantially uniformly distributes the compressive force over the area to be cold welded even when the opposite ends of the tubular element are not closely parallel.

It is still another object of this invention to provide an improved hermetically sealed enclosure for a semiconductor device.

This invention includes providing a tubular ceramic housing with an integral cold welding die on one end, brazing a cold weldable layer onto the integral die, and cold welding the rim of a cover member to the cold weldable layer on the die providing a hermetic thereat. The cold welding apparatus includes a pressure equalizing assembly having a pair of plate elements having facing hemispherical recesses, a bearing ball nested therein, and a coupling assembly for resiliently coupling the plate elements wherein one plate element can slide on the bearing ball thereby equalizing the cold welding compressive forces on the housing.

DETAILED DESCRIPTION OF THE PREFERRED EMBODIMENTS

Figure 1:
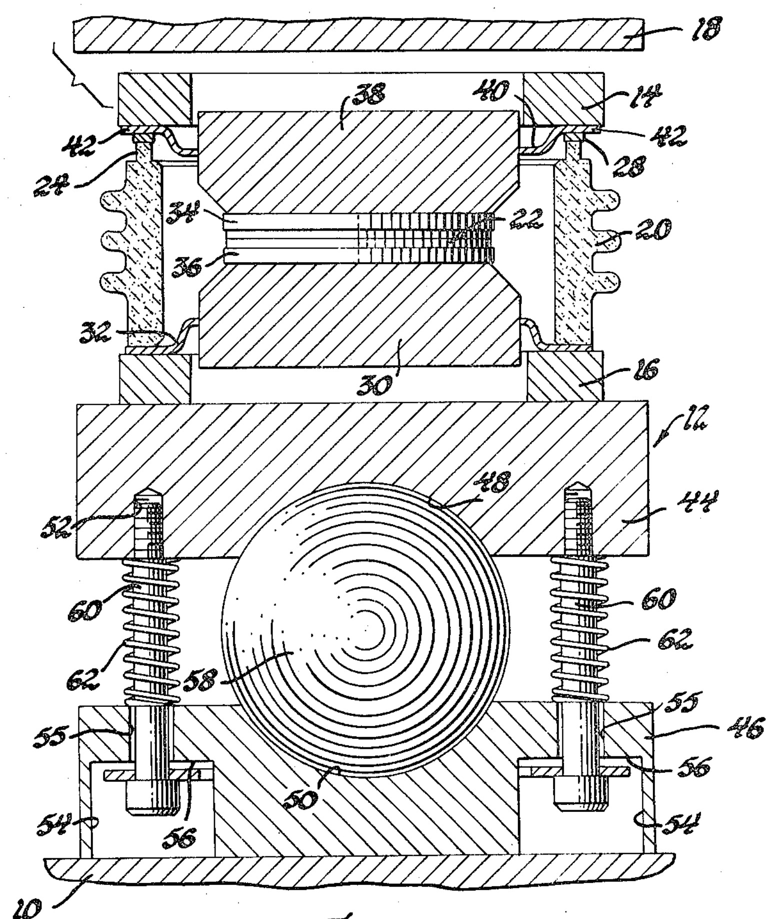
FIG. 1 shows a sectional view of an enclosure and cold welding apparatus used to carry out the invention.

Attention is directed to the drawings and in particular to FIG. 1. It shows a support bed 10, a pressure equalizing assembly 12, front and back welding rings designated 14 and 16, respectively, on opposite ends of an enclosure and a movable anvil 18.

The enclosure includes a tubular ceramic housing 20 with front and back metallic cover members, there being a semiconductor device 22 enclosed therein. Tubular housing 20 which is of aluminum oxide, or the like, has font and back annular faces, the inner edge of both being leveled to inhibit spalling. A plurality of spaced apart convolutions extend radially outward from the outer surface of the housing providing a high voltage capacity therefor. An integral annular circumferential projection 24 extends axially, or perpendicularly, from the front face midway between its outer and inner edges and terminates in a flat land 26. Projection 24 provides a closed integral cold welding die for the housing.

Figure 3:
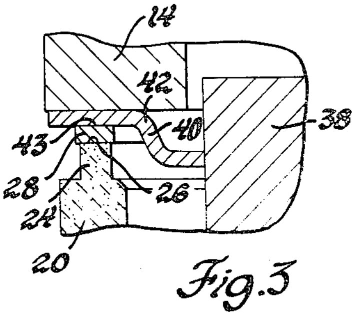
FIG. 3 shows an enlarged detailed view of a portion of FIG. 1.
Figure 4:
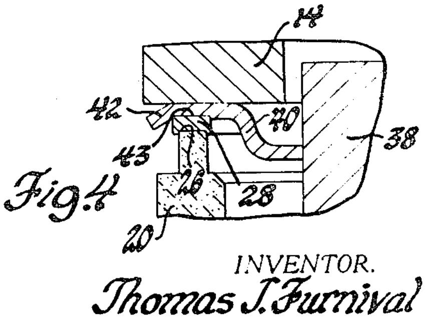
FIG. 4 shows an enlarged detailed view of a portion of FIG. 2.

As is best seen in FIGS. 3 and 4, a copper layer 28 in the form of a closed ring overlies the entire land surface, it being brazed thereto. Brazing, as herein used, refers to a method of securing two contacting surfaces together by fusing a metal therebetween at an elevated temperature. Continuing, the back surface of the ring is coextensive with the land.

Turning to the back cover member, it is made of copper and includes a thick generally cylindrical contact 30 and a stepped rim 32 which is brazed around the longitudinal side of contact 30. The outermost part of rim 32 is brazed to the back annular face of the housing providing a hermetic seal thereat. Contact 30, which has a diameter not substantially smaller than the inside housing diameter, includes a back surface adjacent the back face of the housing and a front surface located centrally therein.

The semiconductor device enclosed within the housing is a disc-shaped rectifier which includes anode and cathode terminals in the form of cylindrical slugs, labelled 34 and 36, respectively. Terminal 36 rests on the front surface of contact 30 and is coextensive therewith.

Referring now to the front cover member, it is also made of copper and includes a thick generally cylindrical contact 38 and a thin stepped circumferential radially extending rim 40 brazed around the longitudinal side of the contact. Contact 38, being similar to contact 30, includes a back surface which engages the terminal 34 centrally within the housing and a front surface adjacent the integral die. Rim 40 includes an outermost section 42 the center portion of which completely overlies the front surface of layer 28 forming a cold weldable interface 43 therebetween.

Discussing now the pressure equalizing assembly 12, it includes a pair of spaced apart steel plate elements 44 and 46, the opposing and facing surfaces of which are flat. The facing surfaces of each plate have facing hemispherical recesses labelled 48 and 50, respectively, which are aligned with each other. Plate 44 has a pair of spaced apart threaded openings 52, extending partway therethrough from its facing surface. Plate 46 has a pair of openings therethrough, each of which being registered with a corresponding threaded opening 52. Each opening through plate 46 includes a large diameter section 54 adjacent its opposing surface and a smaller diameter section 55 adjacent its facing surface with a shoulder 56 therebetween.

A hard steel bearing ball 58, chrome steel alloy or the like, is nested within the space defined by the facing recesses, the radius of curvature of the ball being equal to that of the recesses. The plates are slidably held against opposite hemispherical portions of the ball by coupling means in the form of a bolt 60 within each pair of aligned openings and a spiral-like spring 62 disposed around each bolt. The springs are each attached at their opposite ends to the facing surface of each plate. The head of each bolt, which is of larger diameter than section 55, is within section 54 of the openings through plate 46. The opposite end of each bolt is in threaded engagement with tapped opening 52 terminating midway therein.

Under a no-load or static condition, the opposing and facing surfaces of each plate are horizontal. The head of each bolt is contained nonengagingly within section 54 adjacent shoulder 56 spaced therefrom a predetermined amount. It should be noted that this predetermined spacing determines the amount that the front plate member can slide or pivot on the bearing ball during load or dynamic conditions.

Next discussing the welding rings, they are also made of a hardened steel which can be a chrome alloy or the like. The welding rings, so called herein because they underlie and overlie the faces of the ceramic housing, are of annular configuration. The radial width of each should preferably be at least equal to the radial width of the faces of the ceramic housing. However, acceptable results may be obtained if the width of the front ring is at least equal to that of the land of the integral die.

Tubular housing 20 has pertinent dimensions which include an inside diameter of 1.36 inches, while the end faces are spaced apart by 630 mils. The width of each end face is 120 mils and an integral die extends from the front face 62 mils and is 50 mils in width. The cold weldable members, layer 28 and rim 40 are both 25 mils thick which is preferred for this embodiment. However, as previously mentioned, an important aspect of this invention resides in the fact that thinner cold weldable members can be used. In fact, hermetic seals can be reliably obtained under production line conditions with cold weldable member thicknesses of about 14 mils.

Continuing with other dimensions, each plate member is of a disc-shaped configuration with a diameter of 4 inches and a thickness of 1.25 inches. Each hemispherical groove is centrally located having a depth of 500 mils and a 1-inch radius of curvature; while the bearing ball has a 2inch diameter.

A method of hermetically sealing the tubular housing can now be described. With particular reference to FIG. 1, the back welding ring is centrally located on the front plate. The housing is located coaxially on the back welding ring. The front welding ring is also located coaxially with the housing on its front end.

Figure 2:
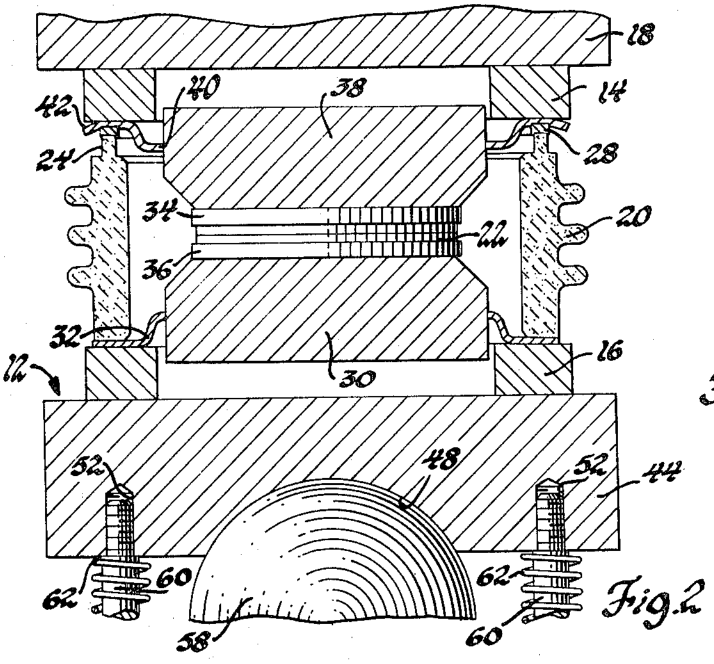
FIG. 2 depicts the cold welding apparatus in pressing engagement with the enclosure.

When the front welding ring engages the rim of the front cover member, as shown in FIG. 2, plate 44 slides or pivots about the arcuate surface of the ball bearing and assumes an orientation which evenly distributes the force over the end faces of the housing. Accordingly, any surface irregularities and/or lack of parallelism between the compressive surfaces is compensated for. Moreover, uneven metal flow during the cold welding operation can also be compensated for by movement of plate 44. When the compressive forces are removed, the spiral-like spring disposed around each bolt can restore the assembly to its original position.

As is generally known, an acceptable cold weld can be obtained if the combined thickness of the cold weldable members is reduced to about 50 – 80 percent of their original thickness, which requires a predetermined compressive force. Heretofore, if one were using thin cold weldable members, a percent reduction of about 80 percent would often be used to insure a continuous cold weld with the attendant risk of puncture. The invention as herein disclosed permits one, in an appropriate application, to obtain a reliable hermetic seal with only about a 50 percent thickness reduction. This greatly decreases the likelihood of damage to an underlying housing. Moreover, since lesser compressive force is required to insure a hermetic seal, cold weldable members of a thickness of about 40 mils each have been successfully cold welded under production line conditions.

It should be noted that although the herein described embodiment has included specific dimensions and has been described with reference to a specific semiconductor device, no such limitation is intended. For example, any suitable semiconductor device, including integrated circuits can be so enclosed. Further, other cold weldable materials such as aluminum and alloys of copper and aluminum can be used for the cover members and the ductile layer. However, copper and particularly commercial oxygen-free high conductivity copper is preferred.

It should also be noted that although the integral cold welding die of this invention has been described as an annular projection such a limitation is not intended. For example, any closed, or continuous, circumferential configuration can be acceptable. In fact, one entire end of the housing could constitute the integral die. Moreover, although the cold weldable layer as herein described preferably overlies coextensively the land of the integral die, such need not be the case. If necessary, the layer need only overlie a portion of the land. However, if one uses a layer width of less than about one-half the radial width of the land in this embodiment, the likelihood of reliably providing hermetic seals under production line conditions can be decreased.

Although this invention has been described in connection with certain specific examples thereof, no limitation is thereby intended except as defined in the appended claims.

I claim:

1. A hermetically sealed enclosure for a semiconductor device which comprises a tubular ceramic housing having a radial periphery and first and second opposite end faces, a first cover member overlying the first end face of said housing and brazed thereto, said first cover member hermetically sealing said first end of said housing, a continuous circumferential annular integral cold welding die on the second end face of said housing, a working face on said cold welding die, an annular cold weldable layer brazed to said die face throughout its circumference, a second cover member on said second end of said housing having a radially extending circumferential rim, said rim overlapping and cold welded to said brazed layer throughout its circumference to hermetically seal said housing within its radial periphery.

2. A hermetically sealed enclosure for a semiconductor device which comprises a tubular ceramic housing having a radial periphery and first and second opposite end faces, a first cover member brazed to the first end face and hermetically sealing the first end of the housing, a continuous circumferential annular integral projection on said second end face of said housing, said projection providing an annular integral cold welding die with an axial face on the second end of said housing, a cold weldable layer, about 10 – 40 mils thick, brazed completely around the circumference of the die face, a second cover member having a radially extending circumferential rim about 10 – 40 mils thick, said rim overlapping and cold welding to said brazed layer completely around the circumference of the die face to hermetically seal said housing within its radial periphery.

3. The enclosure as recited in claim 2 wherein the cold weldable layer is a copper ring about 25 mils thick substantially coextensive with the die face and the rim of the second cover member adjacent the cold weld region is copper about 25 mils thick.

* * * * *